United States Patent
Cheng et al.

(10) Patent No.: US 7,927,924 B2
(45) Date of Patent: Apr. 19, 2011

(54) SEMI-FINISHED PACKAGE AND METHOD FOR MAKING A PACKAGE

(75) Inventors: Ren-Yi Cheng, Kaohsiung (TW); Kuang-Hsiung Chen, Kaohsiung (TW); Chun-Hung Hsu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 119 days.

(21) Appl. No.: 12/387,266

(22) Filed: Apr. 30, 2009

(65) Prior Publication Data
US 2009/0278253 A1    Nov. 12, 2009

(30) Foreign Application Priority Data
May 6, 2008    (TW) .............................. 97116682 A

(51) Int. Cl.
*H01L 23/28*    (2006.01)

(52) U.S. Cl. ......... 438/127; 257/787; 438/106; 438/112

(58) Field of Classification Search .................. 257/723, 257/E23.116, E21.502, 787; 438/127, 106, 438/107, 109, 110, 112, 124
See application file for complete search history.

(56) References Cited

U.S. PATENT DOCUMENTS

| | | | | |
|---|---|---|---|---|
| 6,309,909 | B1* | 10/2001 | Ohgiyama | 438/112 |
| 6,469,932 | B2* | 10/2002 | Roohparvar et al. | 365/185.09 |
| 2004/0029318 | A1 | 2/2004 | Kazama | |

* cited by examiner

*Primary Examiner* — Roy K Potter
(74) *Attorney, Agent, or Firm* — McCraken & Frank LLP

(57) ABSTRACT

The present invention relates to a semi-finished package and a method for making a package. The semi-finished package includes a carrier and at least one molding compound. The molding compound is disposed on a surface of the carrier, and has a body and a plurality of outer protrusions. The outer protrusions are disposed at the periphery of the body, and the height of the outer protrusions is greater than that of the body. Thus, by utilizing the outer protrusions, the rigidity of the semi-finished package is increased, so as to overcome the warpage of the semi-finished package caused by different coefficients of thermal expansion of the molding compound and the carrier. Therefore, the yield rate of the package unit is increased.

11 Claims, 12 Drawing Sheets

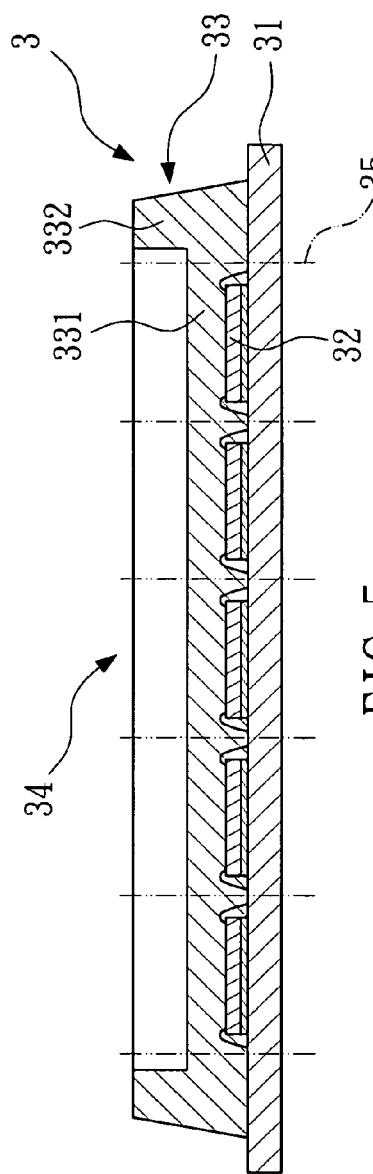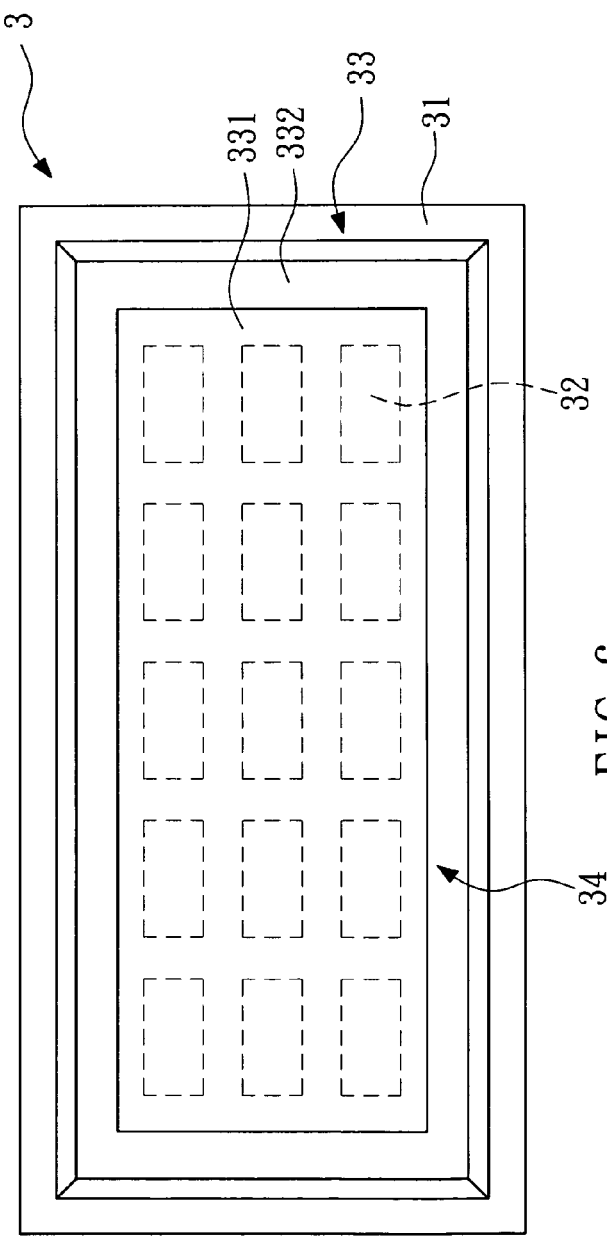

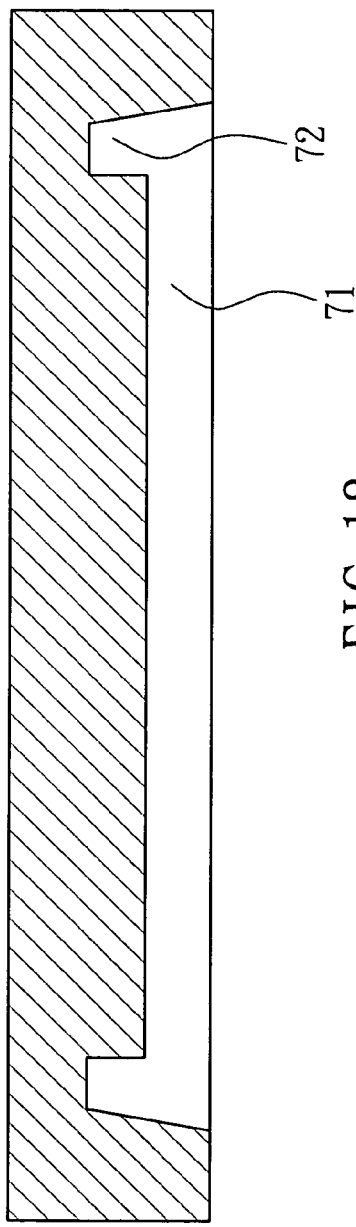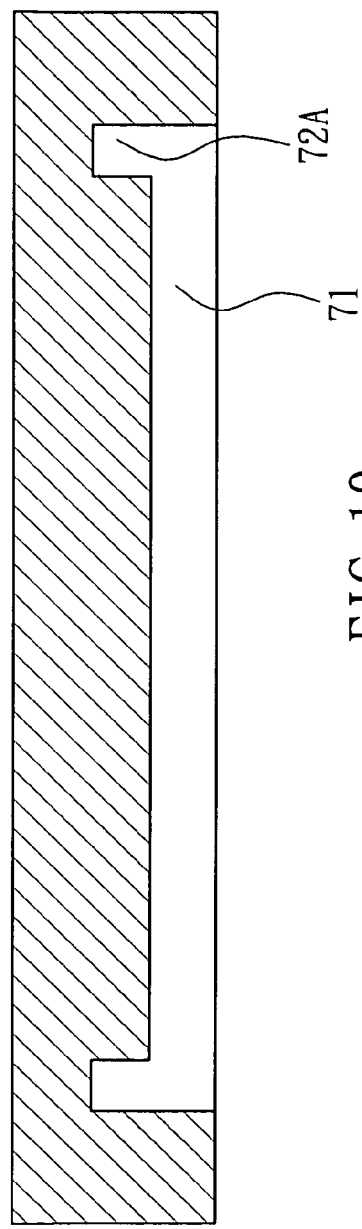
FIG. 18
FIG. 19

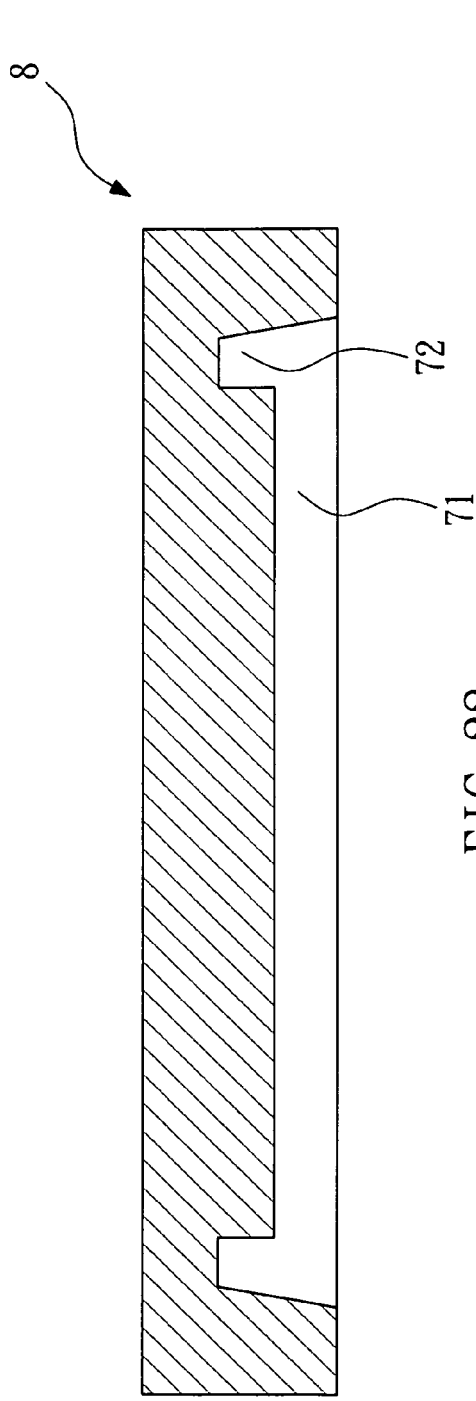
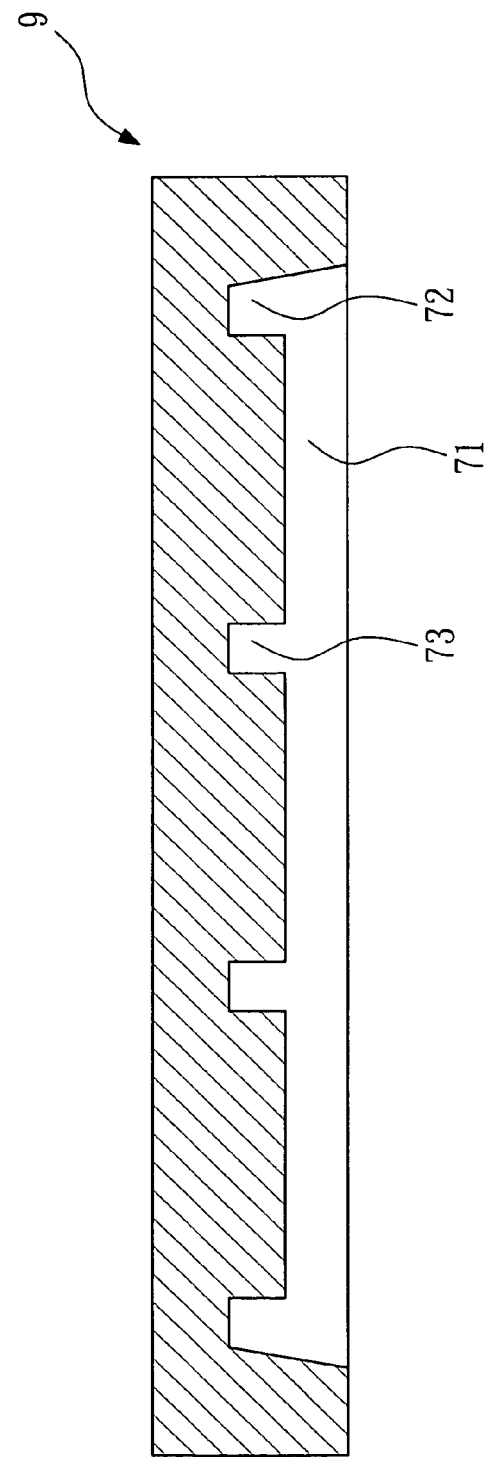

SEMI-FINISHED PACKAGE AND METHOD FOR MAKING A PACKAGE

BACKGROUND OF THE INVENTION

1. Field of the Invention

The present invention relates to a semi-finished package and a method for making a package, and more particularly to a semi-finished package having a molding compound with a plurality of outer protrusions and a method for making a package by cutting the semi-finished package.

2. Description of the Related Art

FIG. 1 shows a cross-sectional view of a first conventional semi-finished package. The first conventional semi-finished package 1 comprises a carrier 11, a plurality of chips 12 and a molding compound 13. The molding compound 13 is disposed on a surface of the carrier 11 so as to encapsulate the chips 12.

The first conventional semi-finished package 1 has the following disadvantage. During a molding process, the molding compound 13 of the first conventional semi-finished package 1 is melted after heating, so as to encapsulate the chips 12. The carrier 11 and the chips 12 expand during the heating process, so that the carrier 11, the molding compound 13 and the chips 12 are combined under high temperature. However, the coefficients of thermal expansion of the above-mentioned devices are different, so the shrinkages of the carrier 11, the molding compound 13 and the chips 12 are different after the molding process is finished and the temperature is lowered, which leads to the warpage of the first conventional semi-finished package 1, as shown in FIG. 2. Moreover, since semiconductor packages are getting smaller and lighter nowadays, the carrier 11 and the molding compound 13 are getting thinner, and the warpage is getting more serious. The overly warped semi-finished package 1 will cause various problems, e.g., it will stick on tables, it will be difficult to hold the package, laser marking will fail, it will be difficult to form solder balls, some solder balls will be missing, the package unit will be overly warped and coplanarity will not exist.

FIG. 3 shows a cross-sectional view of a second conventional semi-finished package disclosed by U.S. 2004/0029318. The second conventional semi-finished package 2 comprises a carrier 21, a plurality of chips 22, a molding compound 23 and a plurality of cutting lines 24. The molding compound 23 is disposed on a surface of the carrier 21 so as to encapsulate the chips 22. The molding compound 23 has a plurality of slots 231 disposed over the chips 22.

The second conventional semi-finished package 2 has the following disadvantage. The second conventional semi-finished package 2 is cut into a plurality of package units 25 after it is cut along the cutting lines 24. However, the molding compound 23 of each package unit 25 still has a slot 231, which influences the appearance of the product.

Therefore, it is necessary to provide a semi-finished package to solve the above problems.

SUMMARY OF THE INVENTION

The present invention is directed to a semi-finished package. The semi-finished package comprises a carrier and at least one molding compound. The molding compound is disposed on a surface of the carrier and has a body and a plurality of outer protrusions. The outer protrusions are disposed at the periphery of the body, and the height of the outer protrusions is greater than that of the body.

The present invention is further directed to a method for making a package. The method comprises the following steps: (a) providing a carrier, having a plurality of chips electrically connected to the carrier; (b) forming at least one molding compound on the carrier so as to encapsulate the chips, wherein the molding compound has a body and a plurality of outer protrusions, the outer protrusions are disposed at the periphery of the body, and the height of the outer protrusions is greater than that of the body; and (c) conducting a cutting process so as to remove the outer protrusions.

Thus, by utilizing the outer protrusions, the rigidity of the semi-finished package is increased, so as to overcome the warpage of the semi-finished package caused by different coefficients of thermal expansion of the molding compound and the carrier. Therefore, the yield rate of the package unit after cutting is increased.

BRIEF DESCRIPTION OF THE DRAWINGS

FIGS. 4 to 7 are schematic views of a method for making a package according to a first embodiment of the present invention;

FIG. 18 is a cross-sectional view of a first type of upper mold used in a method for making a package of the present invention;

FIGS. 19 to 21 are schematic views of different types of second cavities of the upper mold used in a method for making a package of the present invention;

FIG. 22 is a cross-sectional view of a second type of upper mold used in a method for making a package of the present invention;

FIG. 23 is a cross-sectional view of a third type of upper mold used in a method for making a package of the present invention.

DETAILED DESCRIPTION OF THE INVENTION

Figure 1:
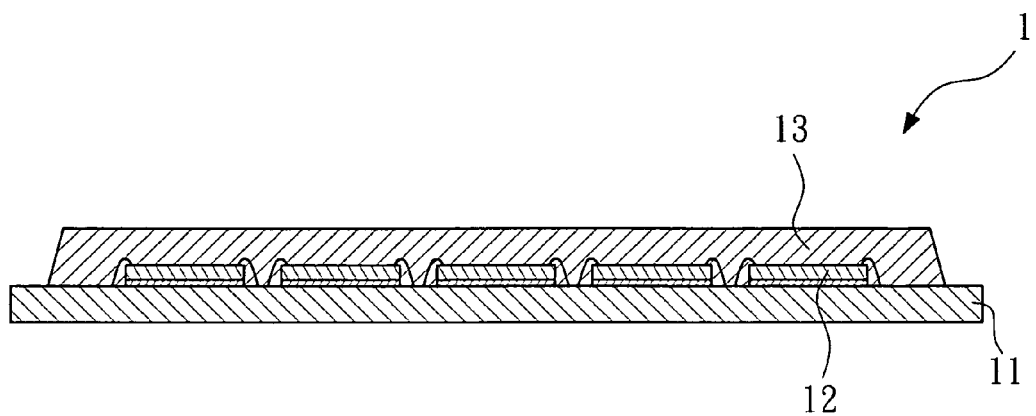
FIG. 1 is a cross-sectional view of a first conventional semi-finished package.
Figure 2:
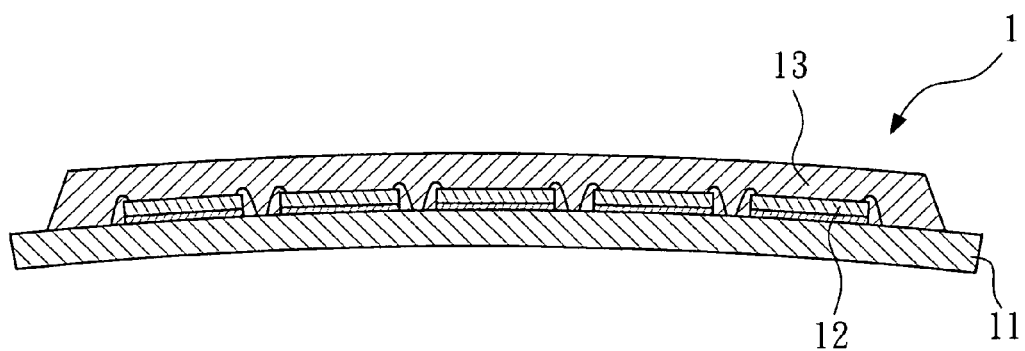
FIG. 2 is a cross-sectional view of a first conventional semi-finished package with warpage.
Figure 3:
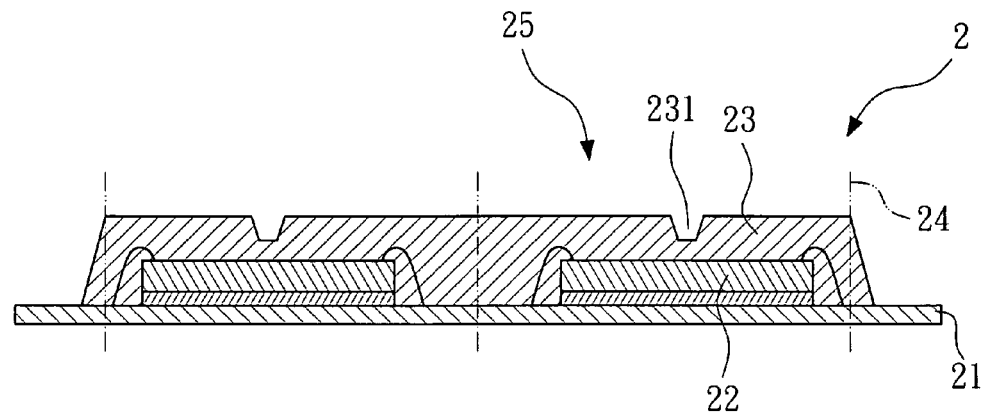
FIG. 3 is a cross-sectional view of a second conventional semi-finished package disclosed by U.S. 2004/0029318.
Figure 4:
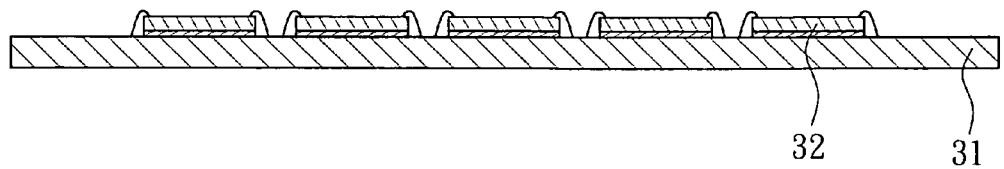

FIGS. 4 to 7 show schematic views of a method for making a package according to a first embodiment of the present invention. First, as shown in FIG. 4, a carrier 31 is provided. The carrier 31 has a plurality of chips 32 electrically connected to it. In the embodiment, the carrier 31 is a substrate; however, in other applications, the carrier 31 may be a leadframe.

As shown in FIGS. 5 and 6, at least one molding compound 33 is formed on the carrier 31 so as to encapsulate the chips 32. The molding compound 33 has a body 331 and a plurality of outer protrusions 332. The outer protrusions 332 are disposed at the periphery of the body 331, and the height of the outer protrusions 332 is greater than that of the body 331.

In the embodiment, the molding compound 33 has four outer protrusions 332 disposed at four sides of the body 331. The outer protrusions 332 define a space 34, and at least one chip 32 is disposed in the space 34. In the embodiment, all of the chips 32 are disposed in the space 34. A semi-finished package 3 according to the first embodiment is formed in this step. Preferably, the semi-finished package 3 further comprises a plurality of cutting lines 35.

Figure 7:
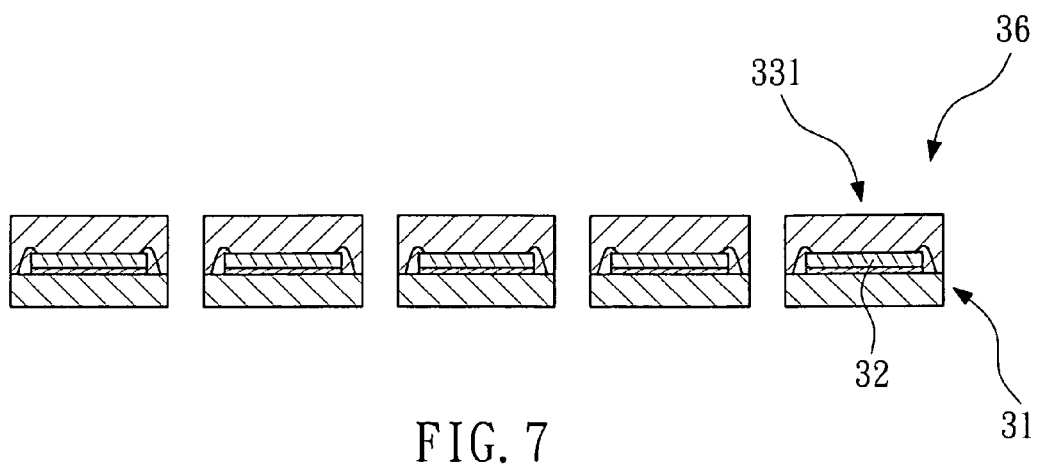

Finally, a cutting process is conducted so as to remove the outer protrusions 332. In the embodiment, the semi-finished package 3 is cut along the cutting lines 35 so as to remove the outer protrusions 332, the body 331 is cut to form a plurality of package units 36, and each of the package units 36 comprises a chip 32, as shown in FIG. 7.

As shown in FIGS. 5 and 6, the semi-finished package 3 according to the first embodiment comprises a carrier 31 and at least one molding compound 33. In the embodiment, the semi-finished package 3 further comprises at least one chip 32.

In the embodiment, the carrier 31 is a substrate; however, in other applications, the carrier 31 may be a leadframe. The chips 32 are adhered and electrically connected to the carrier 31. The molding compound 33 is disposed on a surface of the carrier 31 so as to encapsulate the chips 32. The molding compound 33 has a body 331 and a plurality of outer protrusions 332. In the embodiment, the molding compound 33 has four outer protrusions 332 disposed at four sides of the body 331. The outer protrusions 332 are disposed at the periphery of the body 331, and the height of the outer protrusions 332 is greater than that of the body 331. In the embodiment, the outer protrusions 332 define a space 34, and all of the chips 32 are disposed in the space 34.

Figures 8, 9, 10:
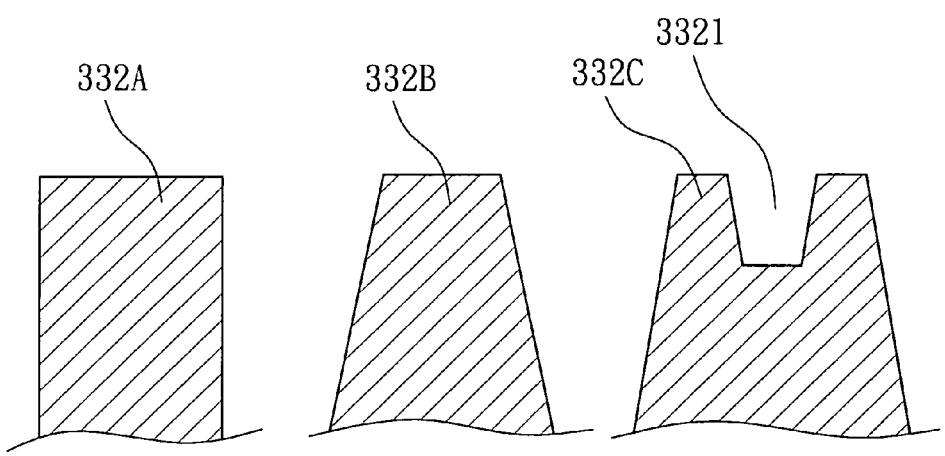
FIGS. 8 to 10 are cross-sectional views of the top of an outer protrusion of a semi-finished package of the present invention.

Moreover, the top of the outer protrusions 332 is a trapezoid from a cross-sectional view. In other applications, the top of the outer protrusions 332 may be other shapes from a cross-sectional view. For example, the top of the outer protrusions 332A in FIG. 8 is a rectangle from a cross-sectional view, and the top of the outer protrusions 332B in FIG. 9 is another type of trapezoid. Alternatively, an upper surface of the outer protrusions 332C further comprises a slot 3321. In the present invention, the height of the outer protrusions 332 is greater than that of the body 331, and the rigidity of the semi-finished package 3 is increased, so as to overcome the warpage of the semi-finished package 3 caused by different coefficients of thermal expansion of the molding compound 33 and the carrier 31. Therefore, the yield rate of the package unit 36 is increased.

Figure 11:
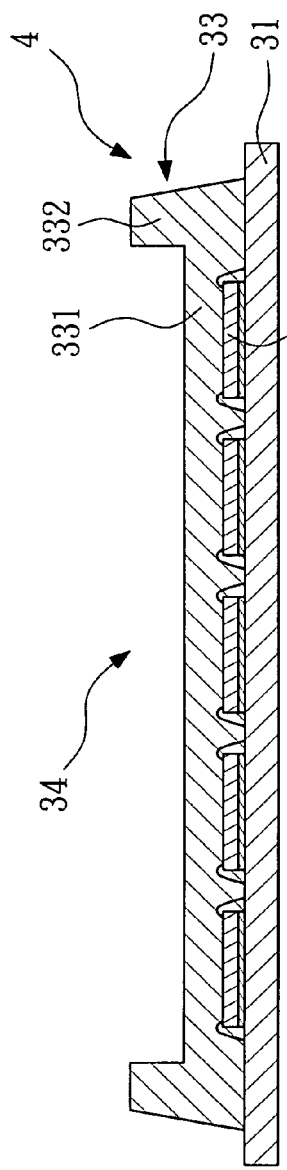
FIG. 11 is a cross-sectional view of a semi-finished package according to a second embodiment of the present invention.
Figure 12:
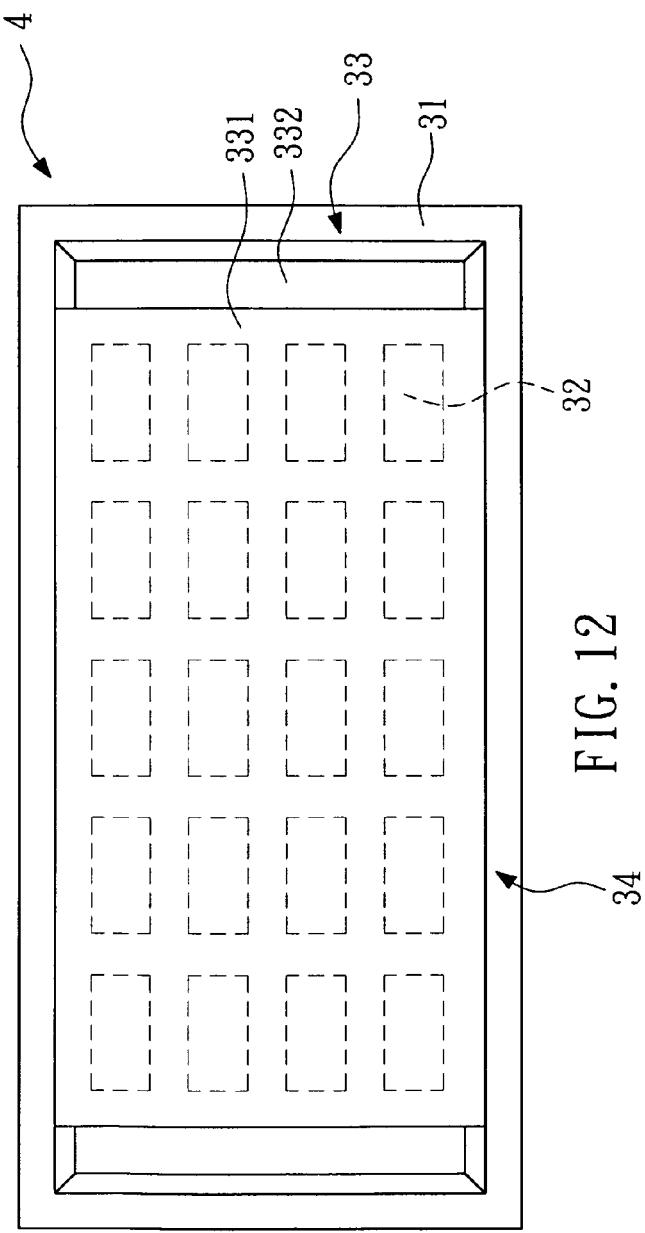
FIG. 12 is a top view of the semi-finished package according to the second embodiment of the present invention.

FIGS. 11 and 12 show schematic views of a method for making a package according to a second embodiment of the present invention. The difference between the method according to the second embodiment and the method according to the first embodiment is the step of forming at least one molding compound 33 on the carrier 31. In the embodiment, the molding compound 33 has two outer protrusions 332 each disposed at opposite sides of the body 331, the two outer protrusions 332 define a space 34, and all of the chips 32 are disposed in the space 34. A semi-finished package 4 according to the second embodiment is formed in this step.

FIGS. 11 and 12 show a cross-sectional view and a top view of the semi-finished package according to the second embodiment of the present invention respectively. The semi-finished package 4 according to the second embodiment is substantially the same as the semi-finished package 3 (FIGS. 5 and 6) according to the first embodiment, and the same elements are designated by the same reference numbers. The difference between the semi-finished package 4 according to the second embodiment and the semi-finished package 3 according to the first embodiment is the structure of the molding compound 33. In the embodiment, the molding compound 33 has two outer protrusions 332 each disposed at opposite sides of the body 331, the outer protrusions 332 define a space 34, and all of the chips 32 are disposed in the space 34.

Figure 13:
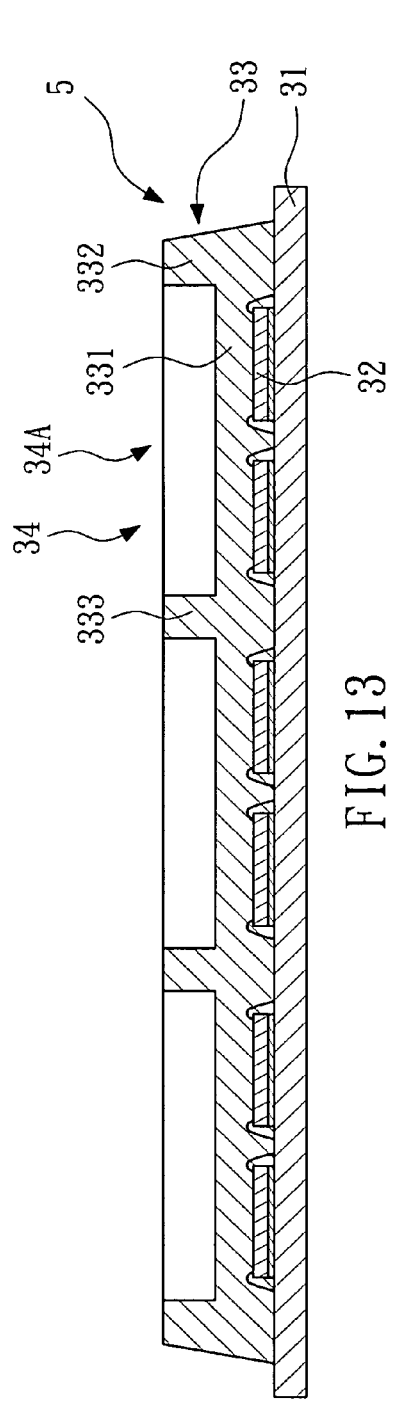
FIG. 13 is a cross-sectional view of a semi-finished package according to a third embodiment of the present invention.
Figure 14:
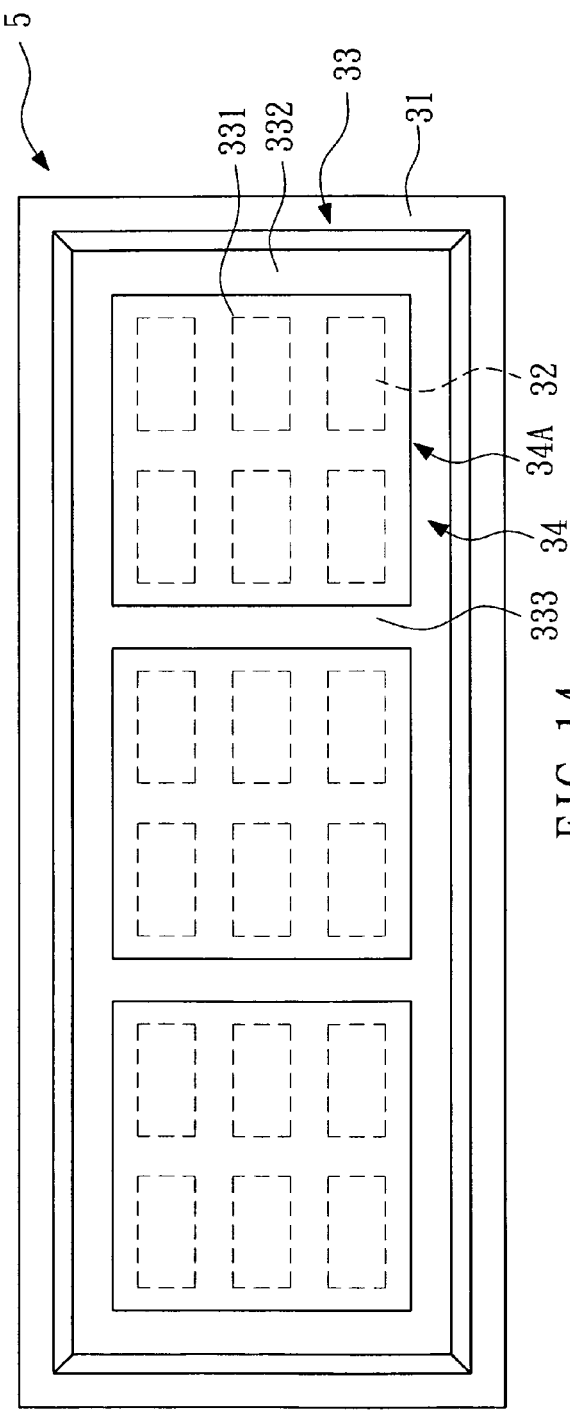
FIG. 14 is a top view of the semi-finished package according to the third embodiment of the present invention.

FIGS. 13 and 14 show schematic views of a method for making a package according to a third embodiment of the present invention. The difference between the method according to the third embodiment and the method according to the first embodiment is the step of forming at least one molding compound 33 on the carrier 31. In the embodiment, the molding compound 33 has four outer protrusions 332, and further has a plurality of inner protrusions 333. The four outer protrusions 332 are disposed at four sides of the body 331. The height of the inner protrusions 333 is greater than that of the body 331, and the inner protrusions 333 connect to the outer protrusions 332. The outer protrusions 332 define a space 34, and the outer protrusions 332 and the inner protrusions 333 define a plurality of sub-spaces 34A. The space 34 includes the sub-spaces 34A. Each of the sub-spaces 34A comprises at least one chip 32. A semi-finished package 5 according to the third embodiment is formed in this step.

FIGS. 13 and 14 show a cross-sectional view and a top view of the semi-finished package according to the third embodiment of the present invention respectively. The semi-finished package 5 according to the third embodiment is substantially the same as the semi-finished package 3 (FIGS. 5 and 6) according to the first embodiment, and the same elements are designated by the same reference numbers. The difference between the semi-finished package 5 according to the third embodiment and the semi-finished package 3 according to the first embodiment is that the molding compound 33 further comprises a plurality of inner protrusions 333. In the embodiment, the molding compound 33 has four outer protrusions 332, and further has a plurality of inner protrusions 333. The four outer protrusions 332 are disposed at four sides of the body 331. The height of the inner protrusions 333 is greater than that of the body 331, and the inner protrusions 333 connect to the outer protrusions 332. The outer protrusions 332 and the inner protrusions 333 define a plurality of sub-spaces 34A, and each of the sub-spaces 34A comprises at least one chip 32.

Figure 15:
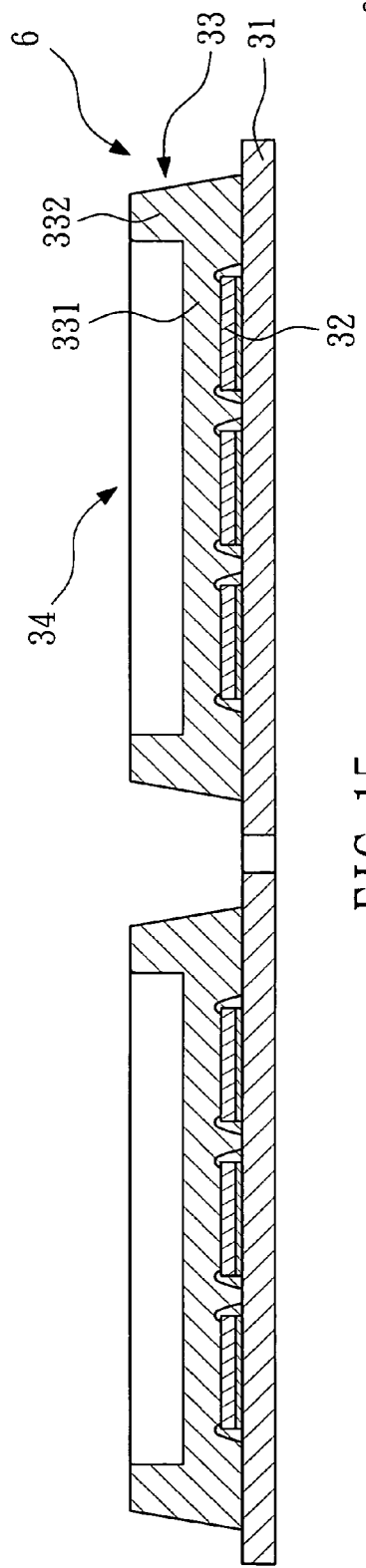
FIG. 15 is a cross-sectional view of a semi-finished package according to a fourth embodiment of the present invention.
Figure 16:
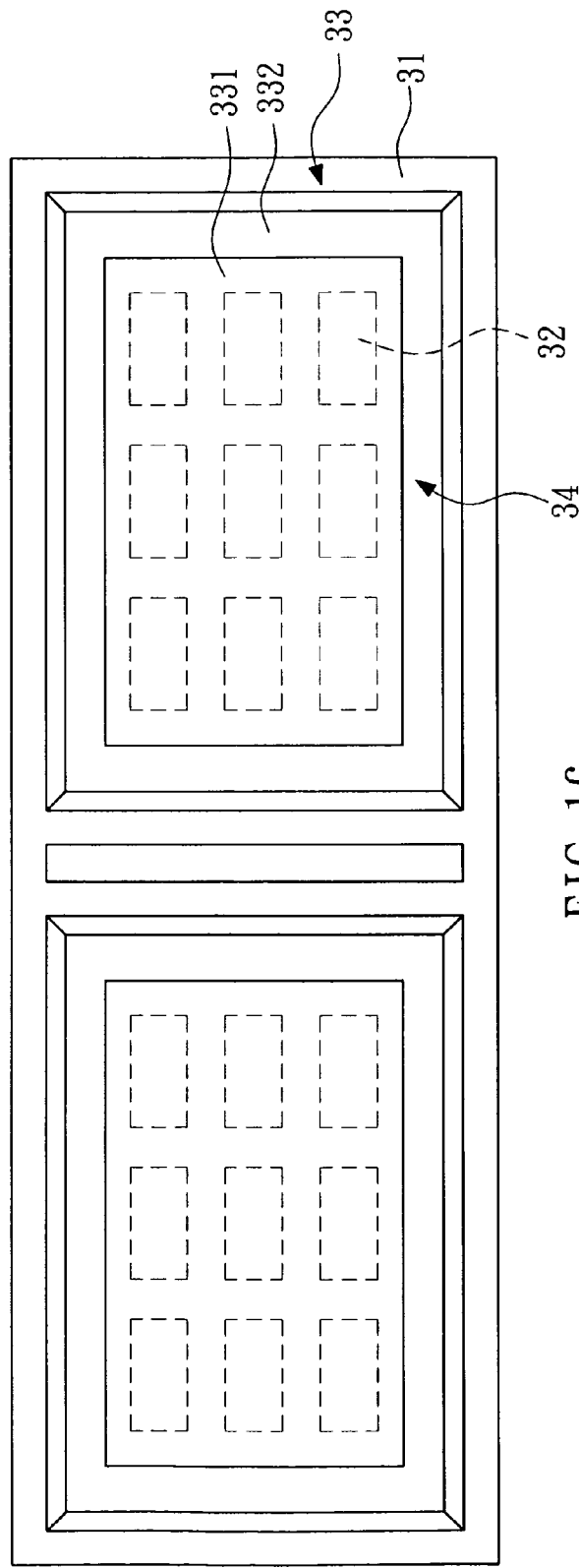
FIG. 16 is a top view of the semi-finished package according to the fourth embodiment of the present invention.

FIGS. 15 to 16 show schematic views of a method for making a package according to a fourth embodiment of the present invention. The difference between the method according to the fourth embodiment and the method according to the first embodiment is that, in the embodiment, a plurality of molding compounds 33 are formed on the carrier 31, and each of the molding compounds 33 has four outer protrusions 332. The four outer protrusions 332 are disposed at four sides of the body 331 of each molding compound 33. The four outer protrusions 332 define a space 34, and each of the spaces 34 comprises at least one chip 32. A semi-finished package 6 according to the fourth embodiment is formed in the step, and the semi-finished package 6 has two molding compounds 33.

FIGS. 15 and 16 show a cross-sectional view and a top view of the semi-finished package according to the fourth embodiment of the present invention respectively. The semi-finished package 6 according to the fourth embodiment is substantially the same as the semi-finished package 3 (FIGS. 5 and 6) according to the first embodiment, and the same elements are designated by the same reference numbers. The difference between the semi-finished package 6 according to the fourth embodiment and the semi-finished package 3 according to the first embodiment is that the semi-finished package 6 comprises a plurality of chips 32 and a plurality of molding compounds 33. In the embodiment, each of the molding compounds 33 has four outer protrusions 332 disposed at four sides of the body 331 of each molding compound 33. The four outer protrusions 332 define a space 34, and each of the spaces 34 has at least one chip 32.

Figure 17:
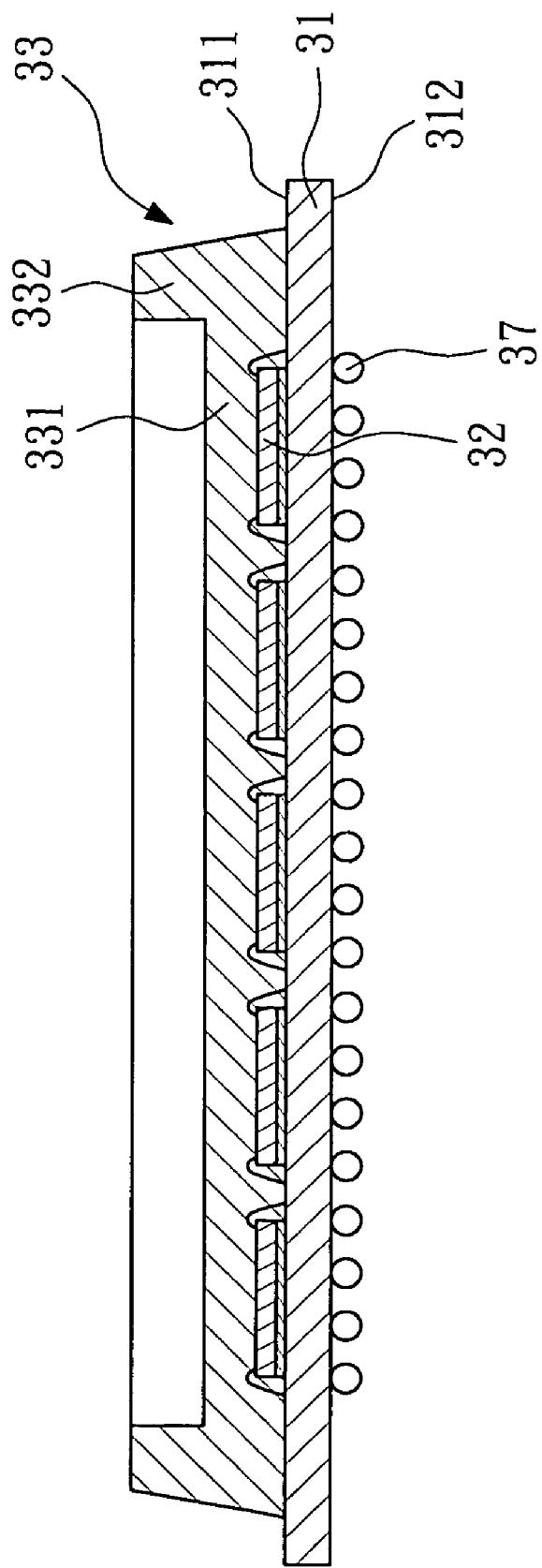
FIG. 17 is a cross-sectional view of a semi-finished package according to a fifth embodiment of the present invention.

FIG. 17 shows a schematic view of a method for making a package according to a fifth embodiment of the present invention. The difference between the method according to the fifth embodiment and the method according to the first embodiment is that, in the embodiment, the method further comprises a step of forming a plurality of solder balls 37 on a lower surface 312 of the carrier 31 after forming at least one molding compound 33 on the upper surface 311 of the carrier 31.

The present invention further relates to an upper mold used in a method for making a package. FIG. 18 shows a cross-sectional view of a first type of upper mold used in the method for making a package of the present invention. The upper mold 7 is used to make the semi-finished package 3 according to the first embodiment (FIGS. 5 and 6), and comprises a first cavity 71 and a plurality of second cavities 72. The first cavity 71 is used to form the body 331 of the molding compound 33 of the semi-finished package 3. The second cavities 72 are used to form the outer protrusions 332 of the molding compound 33 of the semi-finished package 3. Moreover, the second cavities 72 are disposed at four sides of the first cavity 71, and the depth of the second cavities 72 is greater than that of the first cavity 71.

Figure 20:
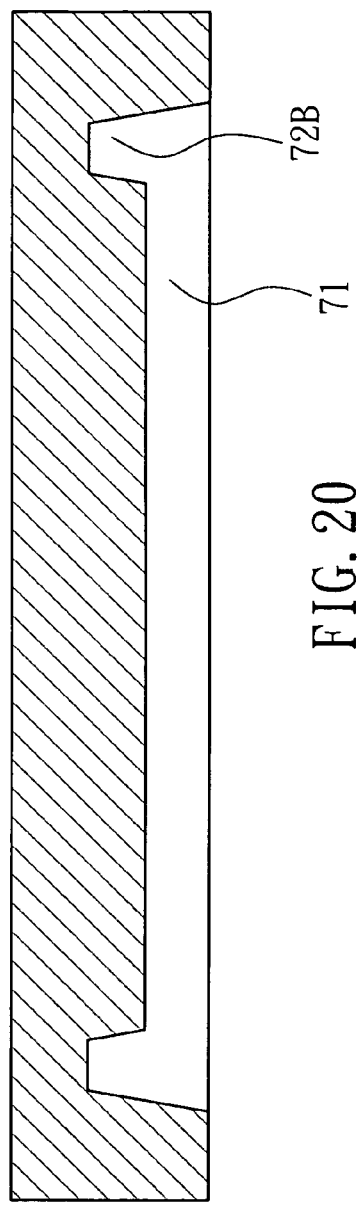
Figure 21:
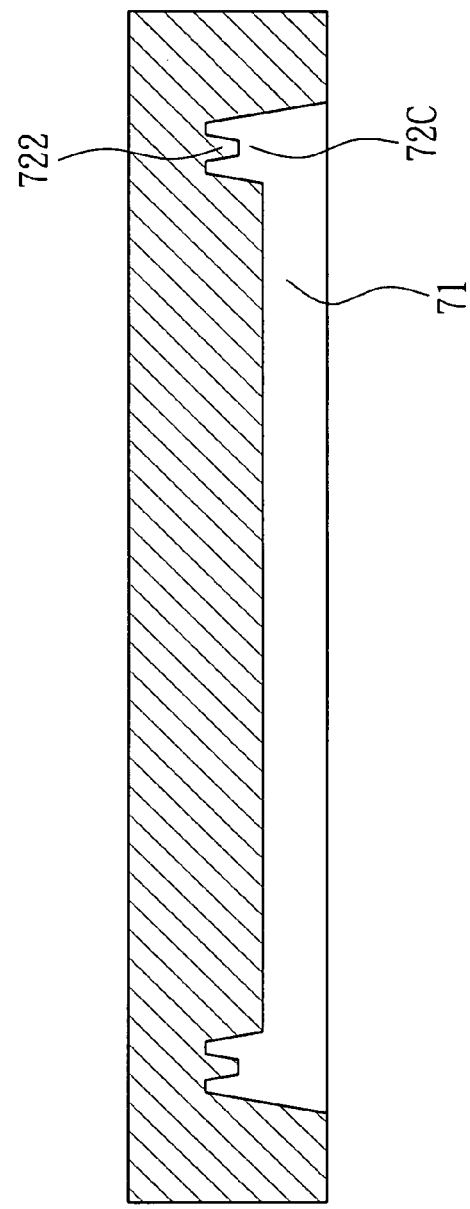

The top of the second cavities 72 is a trapezoid from a cross-sectional view. In other applications, the top of the second cavities 72 may be other shapes from cross-sectional views. For example, the top of the second cavities 72A in FIG. 19 is a rectangle from a cross-sectional view, and the top of the second cavities 72B in FIG. 20 is another type of trapezoid. Alternatively, the top of the second cavities 72C further comprises a groove 722.

FIG. 22 shows a cross-sectional view of a second type of upper mold used in the method for making a package of the present invention. The upper mold 8 is used to make the semi-finished package 4 according to the second embodiment (FIGS. 11 and 12), and comprises a first cavity 71 and a plurality of second cavities 72. The first cavity 71 is used to form the body 331 of the molding compound 33 of the semi-finished package 4. The second cavities 72 are used to form the outer protrusions 332 of the molding compound 33 of the semi-finished package 4. Moreover, the second cavities 72 are disposed at two opposite sides of the first cavity 71, and the depth of the second cavities 72 is greater than that of the first cavity 71.

FIG. 23 shows a cross-sectional view of a third type of upper mold used in the method for making a package of the present invention. The upper mold 9 is used to make the semi-finished package 5 according to the third embodiment (FIGS. 13 and 14), and comprises a first cavity 71, a plurality of second cavities 72 and a plurality of third cavities 73. The first cavity 71 is used to form the body 331 of the molding compound 33 of the semi-finished package 5. The second cavities 72 are used to form the outer protrusions 332 of the molding compound 33 of the semi-finished package 5. The third cavities 73 are used to form the inner protrusions 333 of the molding compound 33 of the semi-finished package 5. Moreover, the second cavities 72 are disposed at four sides of the first cavity 71, the third cavities 73 connect to the second cavities 72, and both the depths of the second cavities 72 and the third cavities 73 are greater than that of the first cavity 71.

Figure 24:
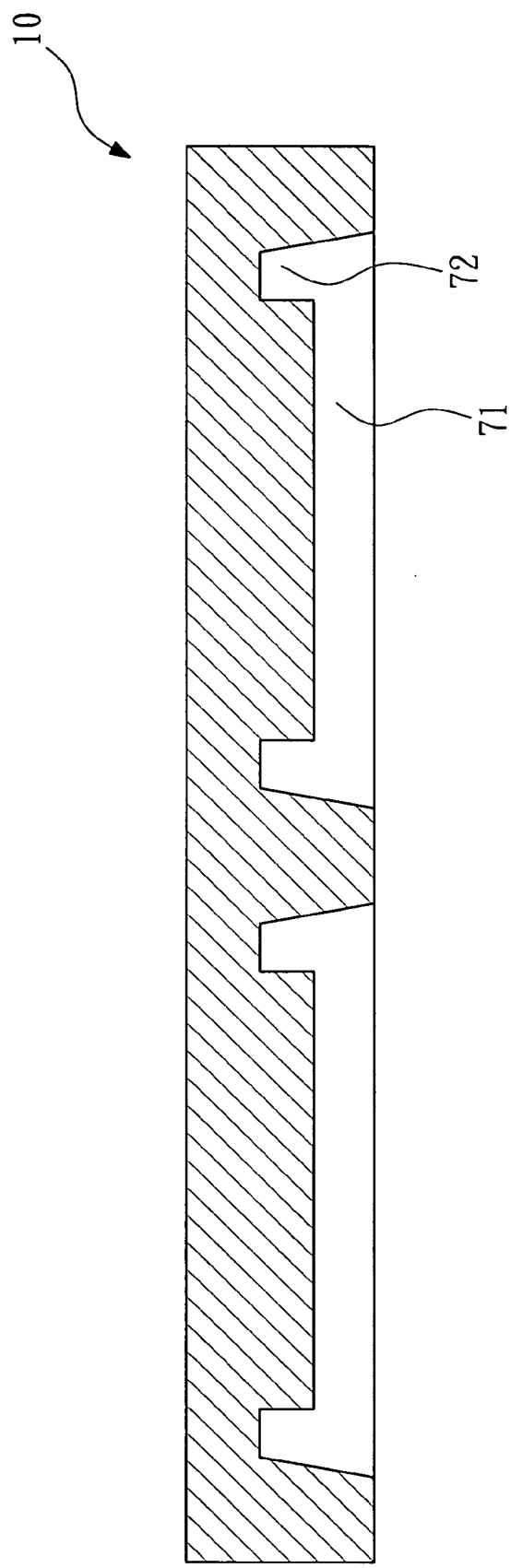
FIG. 24 is a cross-sectional view of a fourth type of upper mold used in a method for making a package of the present invention.

FIG. 24 shows a cross-sectional view of a fourth type of upper mold used in the method for making a package of the present invention. The upper mold 10 is used to make the semi-finished package 6 according to the fourth embodiment (FIGS. 15 and 16), and comprises a plurality of first cavities 71 and a plurality of second cavities 72. The first cavities 71 are used to form the body 331 of the molding compound 33 of the semi-finished package 6. The second cavities 72 are used to form the outer protrusions 332 of the molding compound 33 of the semi-finished package 6. Moreover, the second cavities 72 are disposed at four sides of the first cavities 71, and the depth of the second cavities 72 is greater than that of the first cavities 71.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for making a package, comprising:
   (a) providing a carrier having a plurality of chips electrically connected to the carrier;
   (b) forming at least one molding compound on the carrier so as to encapsulate the chips, wherein the molding compound has a body and a plurality of outer protrusions, the outer protrusions are disposed at the periphery of the body, and the height of the outer protrusions is greater than that of the body; and
   (c) conducting a cutting process so as to remove the outer protrusions.

2. The method as claimed in claim 1, wherein in Step (a), the carrier is a substrate.

3. The method as claimed in claim 1, wherein in Step (b), the outer protrusions define a space, and at least one chip is disposed in the space.

4. The method as claimed in claim 1, wherein in Step (b), a molding compound is formed on the carrier and has four outer protrusions, the four outer protrusions are disposed at four sides of the body and define the space, and all of the chips are disposed in the space.

5. The method as claimed in claim 1, wherein in Step (b), a molding compound is formed on the carrier and has two outer protrusions, the outer protrusions are each disposed at opposite sides of the body and define the space, and all of the chips are disposed in the space.

6. The method as claimed in claim 1, wherein in Step (b), a molding compound is formed on the carrier and has four outer protrusions and a plurality of inner protrusions, the four outer protrusions are disposed at four sides of the body, the inner protrusions connect to the outer protrusions, the height of the inner protrusions is greater than that of the body, the outer protrusions and the inner protrusions define a plurality of sub-spaces, the sub-spaces are included in the space, and at least one chip is disposed in each of the sub-spaces.

7. The method as claimed in claim 1, wherein in Step (b), a plurality of molding compounds are formed on the carrier, each of the molding compounds has four outer protrusions, the four outer protrusions are disposed at four sides of the body and define a plurality of spaces, and at least one chip is disposed in each of the spaces.

8. The method as claimed in claim 1, wherein in Step (b), the outer protrusions are rectangles or trapezoids from a cross-sectional view.

9. The method as claimed in claim 1, wherein in Step (b), each upper surfaces of the outer protrusions further comprises a slot.

10. The method as claimed in claim 1, wherein in Step (c), a cutting process is conducted so as to remove the outer protrusions, and the body is cut so as to form a plurality of package units, and each of the package units comprises a chip.

11. The method as claimed in claim 1, wherein in Step (b), at least one molding compound is formed on an upper surface of the carrier, and which after Step (b), further comprises a step of forming a plurality of solder balls on a lower surface of the carrier, and in Step (c), a cutting process is conducted so as to remove the outer protrusions, and the body is cut so as to form a plurality of package units, and each of the package units comprises a chip.

* * * * *